United States Patent
Zhou et al.

(10) Patent No.: US 10,338,721 B2
(45) Date of Patent: Jul. 2, 2019

(54) DISPLAY SUBSTRATE AND DISPLAY PANEL

(71) Applicant: Shanghai Tianma Micro-Electronics Co., Ltd., Shanghai (CN)

(72) Inventors: Xingyao Zhou, Shanghai (CN); Chuanli Leng, Shanghai (CN); Liang Liu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 33 days.

(21) Appl. No.: 15/722,837

(22) Filed: Oct. 2, 2017

(65) Prior Publication Data
US 2018/0024686 A1    Jan. 25, 2018

(30) Foreign Application Priority Data
Jun. 30, 2017  (CN) .......................... 2017 1 0522562

(51) Int. Cl.
| | |
|---|---|
| *G06F 3/041* | (2006.01) |
| *G02F 1/1333* | (2006.01) |
| *G02F 1/1362* | (2006.01) |
| *G09G 3/3208* | (2016.01) |
| *G09G 3/36* | (2006.01) |
| *H01L 27/32* | (2006.01) |

(52) U.S. Cl.
CPC .......... *G06F 3/0414* (2013.01); *G06F 3/0412* (2013.01); *G06F 3/0416* (2013.01); *G02F 1/13338* (2013.01); *G02F 1/136286* (2013.01); *G09G 3/3208* (2013.01); *G09G 3/36* (2013.01); *G09G 2310/0286* (2013.01); *H01L 27/323* (2013.01); *H01L 27/3265* (2013.01); *H01L 27/3276* (2013.01)

(58) Field of Classification Search
CPC ..................................................... G06F 3/0412
See application file for complete search history.

(56) References Cited

U.S. PATENT DOCUMENTS

| | | | | |
|---|---|---|---|---|
| 2016/0334908 A1* | 11/2016 | Zhuang | ................. | G06F 3/0412 |
| 2017/0010704 A1* | 1/2017  | Chen   | ...................... | G06F 3/0412 |
| 2017/0185211 A1* | 6/2017  | Lu     | ......................... | G06F 3/0412 |

* cited by examiner

*Primary Examiner* — Abdul-Samad A Adediran
(74) *Attorney, Agent, or Firm* — Anova Law Group, PLLC

(57) ABSTRACT

A display substrate comprises a display region and a non-display region surrounding the display region and including at least one display signal line, at least one pressure sensor with two pressure signal output terminals, a first and a second pressure signal output lines electrically connected to two pressure signal output terminals of the corresponding pressure sensor. The first pressure signal output line includes at least one first and at least one second line sections, electrically connected by a first connecting section. The second pressure signal output line includes at least one third and at least one fourth line sections, electrically connected by a second connecting section. All line sections are in parallel to the display signal line. A first distance from the first and third line sections to the display signal line is greater than a second distance from the second and fourth line sections to the display signal line.

20 Claims, 11 Drawing Sheets

DISPLAY SUBSTRATE AND DISPLAY PANEL

CROSS-REFERENCES TO RELATED APPLICATIONS

This application claims the priority of Chinese Patent Application No. CN201710522562.6, filed on Jun. 30, 2017, the entire contents of which are incorporated herein by reference.

FIELD OF THE DISCLOSURE

The present disclosure generally relates to the display technology and, more particularly, relates to a display substrate and a display panel.

BACKGROUND

Mobile terminal devices such as mobile phones and portable computers, etc., and information inquiry devices installed in public areas are often equipped with displays with touch function. As the display technology advances, the touch function of displays become more and more mature, gradually evolving from basic touch-control functions to special touch-control functions such as pressure sensitive touch-control function.

At present, the touch-control display devices often use at least one pressure sensor to provide the pressure sensitive touch-control function. The pressure sensor's capability of sensing the pressure applied by fingers and styluses, etc., substantially expands the application scenarios of the touch-control display devices. In the existing technology, the pressure sensors are often configured in non-display region of display panel, and the pressure sensor is electrically connected by the pressure signal output lines in the non-display region. The pressure sensing signals are sent to a driver chip by the pressure signal output lines. Based on the pressure sensing signals, the driver chip detects the pressure. Each pressure sensor is often connected by two pressure signal output lines. In addition, display signal lines are often configured in the non-display region of the display substrate. The display signal lines are also connected to the driver chip.

According to the present disclosure, coupling noises may exist between the display signal lines and the two pressure signal output lines of each pressure sensor. Each pressure signal output line is coupled with different noise level. The pressure sensing signals carried by the two pressure signal output lines are often affected or corrupted, thus causing incorrect pressure measurement calculated by the driver chip.

The disclosed display substrate and display panel are directed to solve one or more problems set forth above and other problems.

BRIEF SUMMARY OF THE DISCLOSURE

One aspect of the present disclosure provides a display substrate, comprising a display region and a non-display region surrounding the display region. The non-display region includes at least one display signal line, at least one pressure sensor configured with two pressure signal output terminals, and a first pressure signal output line and a second pressure signal output line that correspond to each pressure sensor, and are electrically connected to the two pressure signal output terminals of the corresponding pressure sensor, respectively. The first pressure signal output line includes at least one first line section and at least one second line section. The first line section and the second line section are electrically connected by a first connecting section. The second pressure signal output line includes at least one third line section and at least one fourth line section. The third line section and the fourth line section are electrically connected by a second connecting section. The first line section, the second line section, the third line section, and the fourth line section are configured in parallel to the display signal line. The first line section and the third line section have a first distance to the display signal line. The second line section and the fourth line section have a second distance to the display signal line. The first distance is greater than the second distance.

Another aspect of the present disclosure provides a display panel, comprising a disclosed display substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. Other embodiments obtained by those skilled in the art without making creative work are within the scope of the present invention.

Figure 1A:
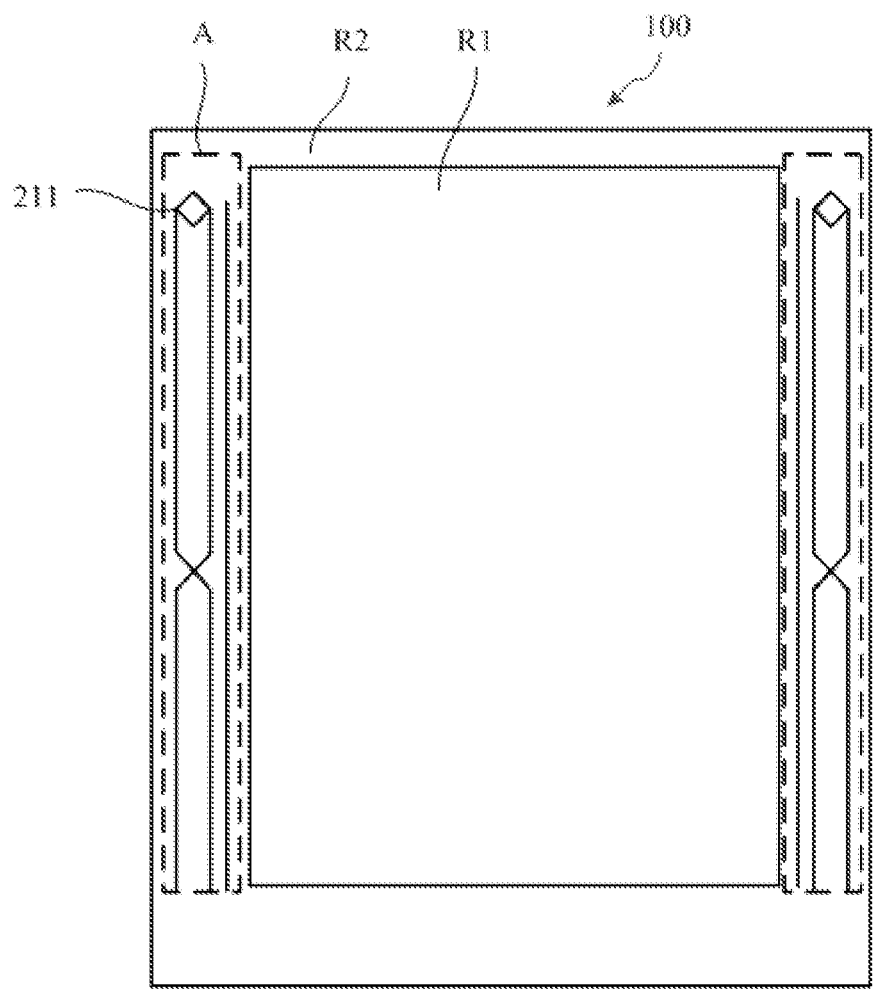
FIG. 1A illustrates a top-down view of an exemplary display substrate according to the disclosed embodiments.
Figure 1B:
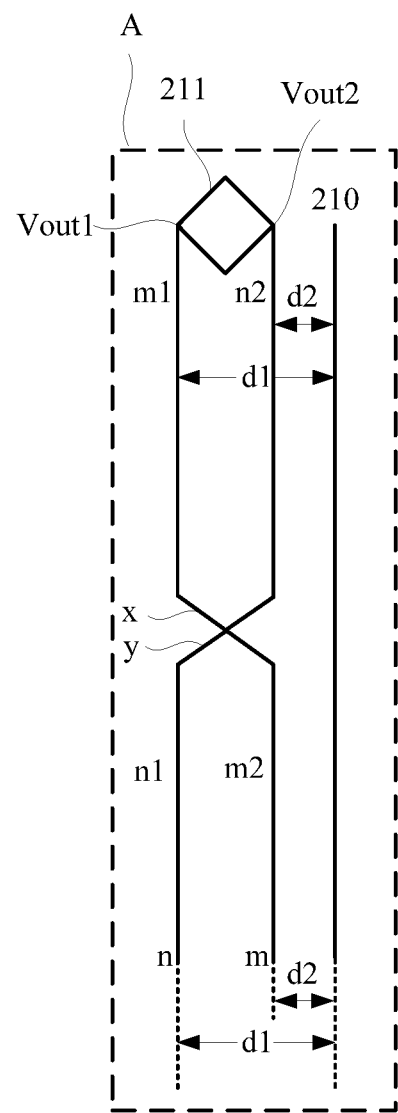
FIG. 1B illustrates an enlarged view of the area A in FIG. 1A.

FIG. 1A illustrates a top-down view of an exemplary display substrate according to the present disclosure. FIG. 1B illustrates an enlarged view of the area A in FIG. 1A. As shown in FIGS. 1A and 1B, the display substrate 100 may include a display region R1 and a non-display region R2 surrounding the display region R1. At least one display signal line 210 and at least one pressure sensor 211 may be configured in the non-display region R2 of the display substrate 100.

Each pressure sensor 211 may be configured with two pressure signal output terminals Vout1 and Vout2, and a first pressure signal output line m and a second pressure signal output line n corresponding to each pressure sensor 211. The first pressure signal output line m and the second pressure signal output line n may be electrically connected to the two pressure signal output terminals Vout1 and Vout2 of the pressure sensor 211, respectively.

The first pressure signal output line m may include at least one first line section m1 and at least one second line section m2. The first line section m1 and the second line section m2 may be electrically connected by a first connecting section x. The second pressure signal output line n may include at least one third line section n1 and at least one fourth line section n2. The third line section n1 and the fourth line section n2 may be electrically connected by a second connecting section y. The first line section m1, the second line section m2, the third line section n1, and the fourth line section n2 may be configured in parallel with the display signal line 210. The first line section m1 and the third line section n1 may have an equal first distance d1 to the display signal line 210. The second line section m2 and the fourth line section n2 may have an equal second distance d2 to the display signal line 210. The first distance d1 may be greater than the second distance d2.

Specifically, referring to FIGS. 1A and 1B, the display substrate 100 may include a display region R1 and a non-display region R2 surrounding the non-display region R1. Display signal lines 210 are often configured in the non-display region R2 of the display substrate 100. For the display substrate 100 having a pressure detection function, in addition to the display signal lines 210, at least one pressure sensor 211 may be configured in the non-display region R2. The pressure sensor 211 may have two pressure signal output terminals Vout1 and Vout2.

When a finger or a stylus, etc., is pressed against the display device, the display substrate 100 may deform. A pressure sensor 211 configured in a corresponding position may detect the deformation, and produce a pressure sensing signal accordingly. The pressure sensing signal may be output by the pressure sensor 211 through the two pressure signal output terminals Vout1 and Vout2. Specifically, the pressure sensing signal output by the two pressure signal output terminals Vout1 and Vout2 may be sent to a driver chip through the first pressure signal output line m and the second pressure signal output line n. The driver chip may calculate the pressure based on the two pressure sensing signals.

As shown in FIG. 1B, the first pressure sensing signal Vout1 output by the first pressure signal output terminal Vout1 of the pressure sensor 211 may be carried by the first pressure signal output line m. The second pressure sensing signal Vout2 output by the second pressure signal output terminal Vout2 of the pressure sensor 211 may be carried by the second pressure signal output line n. However, in the signal line layout of the display substrate 100, because a first coupling noise N1 occurs between the first pressure signal output line m and the display signal line 210, and a second coupling noise N2 occurs between the second pressure signal output line n and the display signal line 210, the pressure sensing signal difference V between the first pressure signal output line m and the second pressure signal output line n may be calculated by the following equation:

$$V = Vout1 + N1 - (Vout2 + N2).$$

When N1 and N2 are not equal, the pressure sensing signal actually received by the driver chip from the pressure sensor 211 may be distorted, and the pressure calculated by the driver chip may be incorrect.

In one embodiment, in the non-display region R2 of the display substrate 100, the first line section m1 and the second line section m2 of the first pressure signal output line m, and the third line section n1 and the fourth line section n2 of the second pressure signal output line n may be configured in parallel with the display signal line 210. The first line section m1 and the third line section n1 may have an equal distance to the display signal line 210. The second line section m2 and the fourth line section n2 may have an equal distance to the display signal line 210. In this case, a coupling noise occurred between the first line section m1 and the display signal line 210 may be N11. A coupling noise occurred between the second line section m2 and the display signal line 210 may be N12. A coupling noise occurred between the third line section n1 and the display signal line 210 may be N21. A coupling noise occurred between the fourth line section n2 and the display signal line 210 may be N22. The pressure signal difference V' between the first pressure signal output line m and the second pressure signal output line n may be calculated by the following equation:

$$V' = Vout1 + N11 + N12 - (Vout2 + N21 + N22).$$

With respect to the pressure signal output lines, the coupling noises appearing on the first line section m1, the second line section m2, the third line section n1, and the fourth line section n2, which are parallel with the display signal line 210, may be dominant. Thus, the coupling noises between the first line section m1 and the second line section m2 of the first pressure signal output line m and the paralleled display signal line 210 and between the third line section n1 and the fourth line section n2 of the second pressure signal output line n and the paralleled display signal 210 may be primarily considered. That is, the pressure signal difference V' between the first pressure signal output line m and the second pressure signal output line n may be obtained by only considering the coupling noises appearing on the first line section m1, the second line section m2, the third line section n1, and the fourth line section n2, which are parallel to the display signal line 210.

Because the first line section m1 and the third line section n1 have an equal first distance d1 to the display signal line 210, and the second line section m2 and the fourth line section n2 have an equal second distance d2 to the display signal line 210, the coupling noises N11 and N21 may be similar, and the coupling noises N12 and N22 may be similar too. As a result, the pressure sensing signal difference Tr actually received by the driver chip may be substantially close or almost equal to the actual difference between the Vout1 and Vout2 output by the pressure sensor. Thus, the precision of pressure measurement may be improved.

It should be noted that only one pressure sensor 211 and one display signal line 210 are shown on each of the two sides of the display region in FIGS. 1A and 1B. In real life scenarios, a plurality of pressure sensors 211 and a plurality of display signal lines 210 may be configured on both sides or all four sides of the display region R1. When the plurality of pressure sensors 211 are configured, the first pressure signal output line m and the second pressure signal output line n corresponding to each pressure sensor 211 may satisfy the above condition. When the plurality of display signal lines 210 are configured, because each display signal line is parallel with each other, the above condition may be satisfied between the first line section m1, the second line section m2, the third line section n1, the fourth line section n2, and any one of the display signal lines 210.

In addition, in certain embodiments, the number of line sections such as the first line section m1 and the second line section m2 on the first pressure signal output line m and the number of line sections such as the third line section n1 and the fourth line section on the second pressure signal output line n are not limited by the present disclosure.

Figure 2:
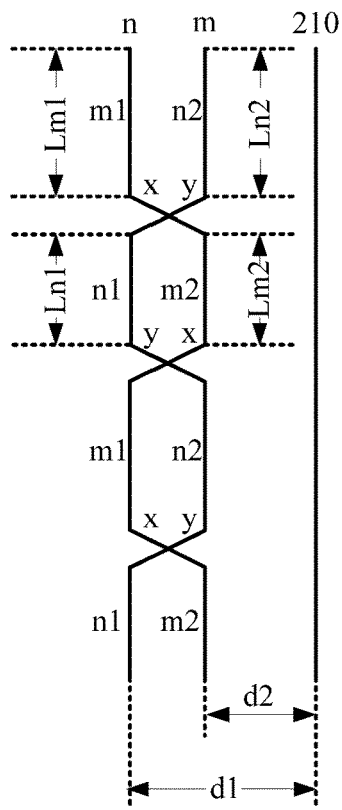
FIG. 2 illustrates a schematic view of an exemplary pair of pressure signal output lines according to the disclosed embodiments.

FIG. 2 illustrates a schematic view of an exemplary pair of pressure signal output lines according to the present disclosure. As shown in FIG. 2, a total length of the first line sections m1 on the first pressure signal output line m may be equal to a total length of the third line sections n1 on the second pressure signal output line n, and a total length of the second line sections m2 on the first pressure signal output line m may be equal to a total length of the fourth line sections n2 on the second pressure signal output line n.

Specifically, a unit length of any pressure signal output line that has an equal distance to the display signal line may be subject to a same level of coupling noise. Referring to FIG. 2, the two output terminals Vout1 and Vout2 of the pressure sensor 211 in the display substrate 100 may be connected to the first line section m1 having a length of Lm1 and the second line section m2 having a length of Lm2 of the first pressure signal output line m, and the third line section n1 having a length of Ln1 and the fourth line section n2 having a length of Ln2 of the second pressure signal output line n, respectively.

For example, N1 may be a coupling noise for a unit length of the first line section m1 and the third line section n1, both of which have a first distance d1 to the display signal line 210, and N2 may be a coupling noise for a unit length of the second line section m2 and the fourth line section n2, both of which have a second distance d2 to the display signal line 210. When the first pressure signal output line m includes a number of first line sections m1 and b number of second line sections m2, and the second pressure signal output line n includes c number of third line sections n1 and d number of fourth line sections n2, the coupling noises of the first line sections m1, the second line sections m1, the third line sections n1, and the fourth line sections n2 with respect to the display signal line 210 may be Nm1, Nm2, Nn1, and Nn2, as shown in the equations below:

$Nm1 = a \times Lm1 \times N1$, $Nm2 = b \times Lm2 \times N2$, $Nn1 = c \times Ln1 \times N1$, $Nn2 = d \times Ln2 \times N2$.

It can be seen that when the total length a×Lm1 of the first line sections m1 and the total length c×Ln1 of the third line sections n1 are equal, the coupling noise Nm1 of the first line sections m1 and the coupling noise Nn1 of the third line sections n1 may be equal. Similarly, when the total length b×Lm2 of the second line sections m2 and the total length d×Ln2 of the fourth line sections n2 are equal, the coupling noise Nm2 of the second line sections m2 and the coupling noise Nn2 of the fourth line sections n2 may be equal. In this case, the pressure signal difference V' between the first pressure signal output line m and the second pressure signal output line n which carry the signals from the two output terminals of the pressure sensor 211 may be:

$V' = Vout1 + Nm1 + Nm2 - (Vout2 + Nn1 + Nn2) = Vout1 - Vout2$.

With respect to the pressure signal output lines, the coupling noises appearing on the first line section m1, the second line section m2, the third line section n1, and the fourth line section n2, which are parallel with the display signal line 210, may be dominant. Thus, the coupling noises between the first line section m1 and the second line section m2 of the first pressure signal output line m and the paralleled display signal line 210 and between the third line section n1 and the fourth line section n2 of the second pressure signal output line n and the paralleled display signal 210 may be primarily considered. That is, the pressure signal difference V' between the first pressure signal output line m and the second pressure signal output line n which carry the signals from the two output terminals of the pressure sensor 211 may be obtained by only considering the coupling noises appearing on the first line section m1, the second line section m2, the third line section n1, and the fourth line section n2, which are parallel to the display signal line 210.

Thus, making the total length of the first line sections m1 on the first pressure signal output line m equal to the total length of the third line sections n1 on the second pressure signal output line n, and making the total length of the second line sections m2 on the first pressure signal output line m equal to the total length of the fourth line sections n2 on the second pressure signal output line n may, to certain degree, mitigate the distortion caused by different coupling noises appearing on the two pressure signal output lines with respect to the display signal line 210, and may more precisely calculate the pressure measurement.

In one embodiment, referring to FIG. 2, the first pressure signal output line m may have a first number of first line sections m1 and a first number of second line sections m2. The second pressure signal output line n may have a second number of third line sections n1 and a second number of fourth line sections n2. The first number may be equal to the second number. That is, the number of first line sections m1, the number of second line sections m2, the number of third line sections n1, and the number of fourth line sections n2 may be equal. Thus, the first pressure signal output line m and the second pressure signal output line n may have an almost symmetrical structure, and may reduce the complexity of the fabrication process.

Figure 3:
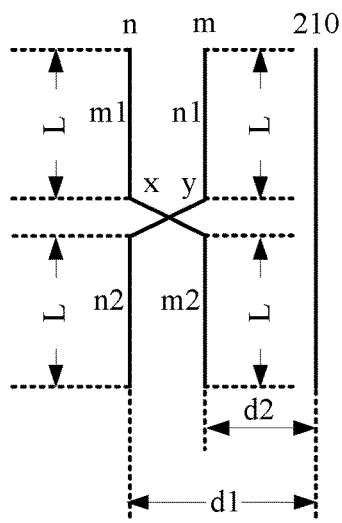
FIG. 3 illustrates a schematic view of another exemplary pair of pressure signal output lines according to the disclosed embodiments.

FIG. 3 illustrates a schematic view of another exemplary pair of pressure signal output lines according to the present disclosure. In one embodiment, the lengths of the first line section m1, the second line section m2, the third line section n1, and the fourth line section n2 may be equal. That is:

$$L=Lm1=Lm2=Ln1=Ln2.$$

In addition, the numbers of the first line section m1, the second line sections m2, the third line sections n1, and the fourth line sections n2 may be equal. Making the coupling noises appearing on the first pressure signal output line m and the second pressure signal output line n equal with respect to the display signal line 210 may be easier to achieve in the present disclosure.

In addition, in the certain embodiments, the only scenarios considered may be coupling noises appearing on the first line sections m1 and the second line sections m2 of the first pressure signal output line m and the third line sections n1 and the fourth line sections n2 of the second pressure signal output line n, all of which are parallel to the display signal line 210. However, the first connecting sections x and the second connecting sections y may cause inconsistent or different coupling noises on the first pressure signal output line m and the second pressure signal output line n.

Specifically, to solve the problem, referring to the examples in FIG. 1B, FIG. 2, and FIG. 3, the first connecting sections x and the second connecting sections y may be paired and crossed with each other, and arranged alternately. The following two methods for mitigating the inconsistent or different coupling noises on the two pressure signal output lines with respect to the display signal line caused by the first connecting sections x and the second connecting sections y are discussed.

In the first method, the lengths of the first connecting sections x and the second connecting sections y may be configured to be substantially shorter than the pressure signal output lines so that the coupling noise contributions by the connecting sections may be negligible. In one embodiment, the ratio of a total length of the first connecting sections x over the length of the first pressure signal output line m may be less than 1:10, and the ratio of a total length of the second connecting sections y over the length of the second pressure signal output line n may be less than 1:10.

The total length of the first pressure signal output line m may include the length of all first line sections m1, the length of all second line sections m2, and the length of all first connecting sections x. Similarly, the total length of the second pressure signal output line n may include the length of all third line sections n1, the length of all fourth line sections n2, and the length of all second connecting sections y. In this case, the ratio of the total length of all first connecting sections x over the length of the first pressure signal output line m may be less than 1:10, and the ratio of the total length of all second connecting sections y over the length of the second pressure signal output line n may be less than 1:10. That is, the total length of all first connecting sections x and all second connecting sections y may be kept as short as possible so that the coupling noise inconsistency or difference caused by the first connecting sections x and the second connecting sections y may be negligible.

Figure 4A:
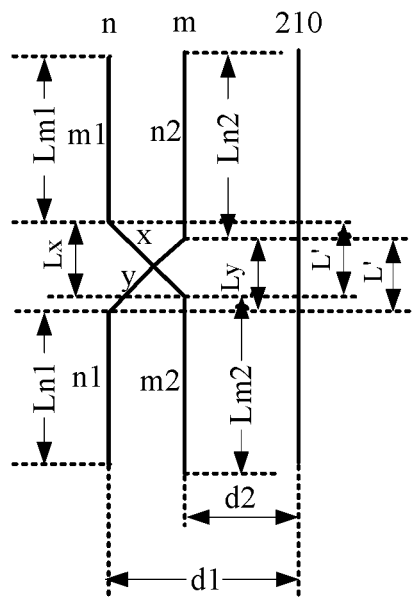
FIG. 4A illustrates a schematic view of another exemplary pair of pressure signal output lines according to the disclosed embodiments.
Figure 4B:
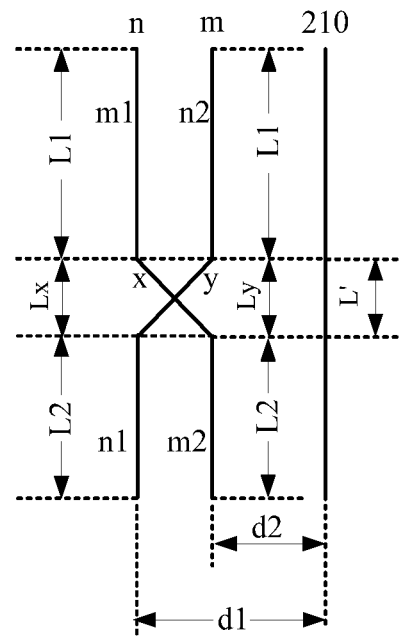
FIG. 4B illustrates a schematic view of another exemplary pair of pressure signal output lines according to the disclosed embodiments.

FIG. 4A illustrates a schematic view of another exemplary pair of pressure signal output lines according to the present disclosure. FIG. 4B illustrates a schematic view of another exemplary pair of pressure signal output lines according to the present disclosure. In the second method, referring to FIG. 4A and FIG. 4B, the orthogonal projection of the first connecting section x on the extension direction of the display signal line 210 may have a section length Lx, the orthogonal projection of the corresponding second connecting section y on the extension direction of the display signal line 210 may have a section length Ly, and Lx=Ly.

Specifically, as shown in FIG. 4A, the first pressure signal output line m may include a first line section m1 having a length Lm1, and a second line section m2 having a length Lm2. The second pressure signal output line n may include a third line section n1 having a length Ln1, and a fourth line section n2 having a length Ln2. The first connecting section x which connects the first line section m1 and the second line section m2 may have a length Lx orthogonally projected on the extension direction of the display signal line 210, and the second connecting section y which connects the third line section n1 and the fourth line section n2 may have a length Ly orthogonally projected on the extension direction of the display signal line 210.

The length Lm1 of the first line section m1 and the length Ln2 of the fourth line section n2 may not be equal. The length Lm2 of the second line section m2 and the length Ln1 of the third line section n2 may not be equal. The length Lx of the first connecting section x orthogonally projected on the display signal line 210 may be made equal to the length Ly of the second connecting section y orthogonally projected on the display signal line 210 by wiring layout, that is:

$$L'=Lx=Ly.$$

In addition, as shown in FIG. 4B, when the length of the first line section m1 is equal to the length of the fourth line section n2, and the length of the second line section m2 is equal to the length of the third line section n1, the length Lx of the first connecting section x orthogonally projected on the display signal line 210 may be equal to the length Ly of the second connecting section y orthogonally projected on the display signal line 210. Thus, the coupling noise between the first connecting section x and the display signal line 210 may be equal to the coupling noise between the second connecting section y and the display signal line 210.

In this case, when the total length of the first line sections m1 of the first pressure signal output line m is equal to the total length of the third line sections n1 of the second pressure signal output line n, and the total length of the second line sections m2 of the first pressure signal output line m is equal to the total length of the fourth line sections n2 of the second pressure signal output line n, the distortion caused by the coupling noises between the first pressure signal output line m and the display signal line 210 and between the second pressure signal output line n and the display signal line 210 may be mitigated.

In one embodiment, referring to FIG. 2, the first pressure signal output line m may include a plurality of first line sections m1 and a plurality of second line sections m2, and the second pressure signal output line n may include a plurality of third line sections n1 and a plurality of fourth line sections n2. As long as the conditions expressed in the equations are satisfied, the numbers of the first line sections m1, the second line sections m2, the third line sections n1, and the fourth line sections n2 are not limited by the present disclosure.

Figure 5:
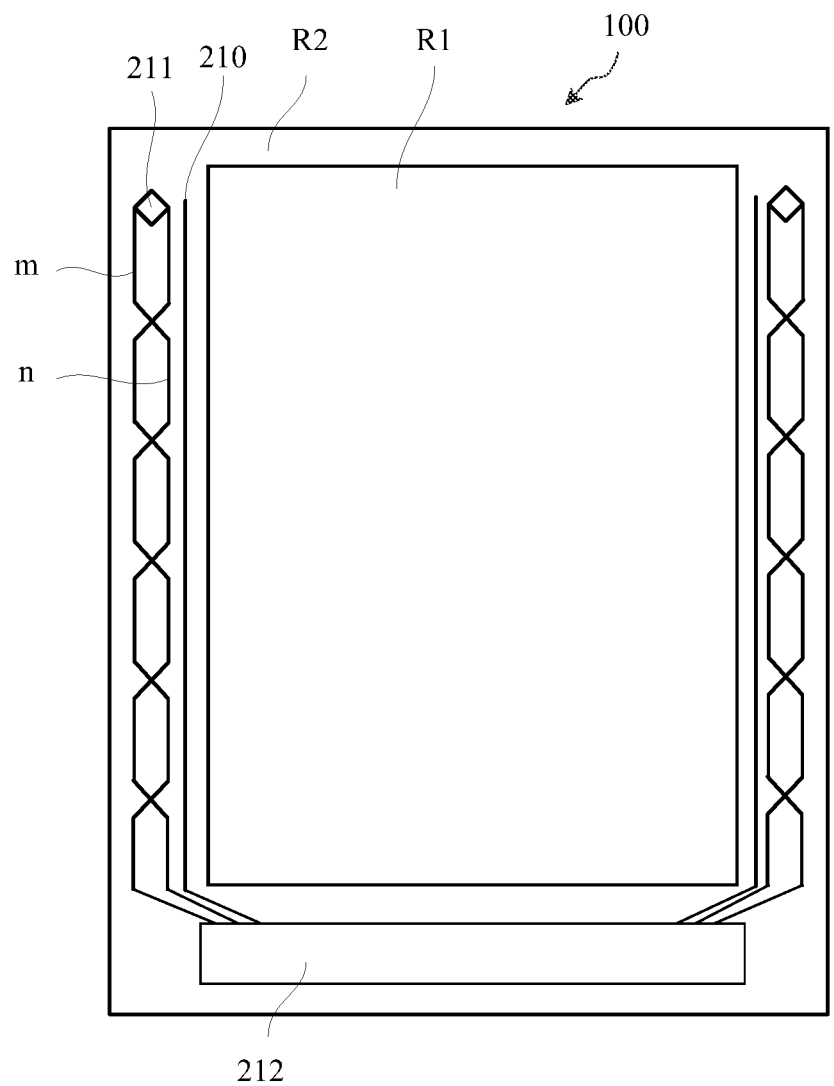
FIG. 5 illustrates a top-down view of another exemplary display substrate according to the disclosed embodiments.

FIG. 5 illustrates a top-down view of another exemplary display substrate according to the present disclosure. As shown in FIG. 5, a driver chip 212 may be configured in the non-display region R2 of the display substrate 100. The first pressure signal output line m and the second pressure signal output line n may be electrically connected to the driver chip 212.

Specifically, referring to FIG. 5, the driver chip 212 configured in the non-display region R2 of the display substrate 100 may be electrically connected to the first pressure signal output line m and the second pressure signal output line n to detect the pressure sensing signals output by the pressure signal output terminals of the pressure sensor 211. The driver chip 212 may also be electrically connected to the display signal 210. The driver chip 212 may be a common driver chip providing both the display function and the pressure detection function such that one driver chip may be eliminated in the configuration and the fabrication cost of the display substrate 100 may be reduced.

Figure 6A:
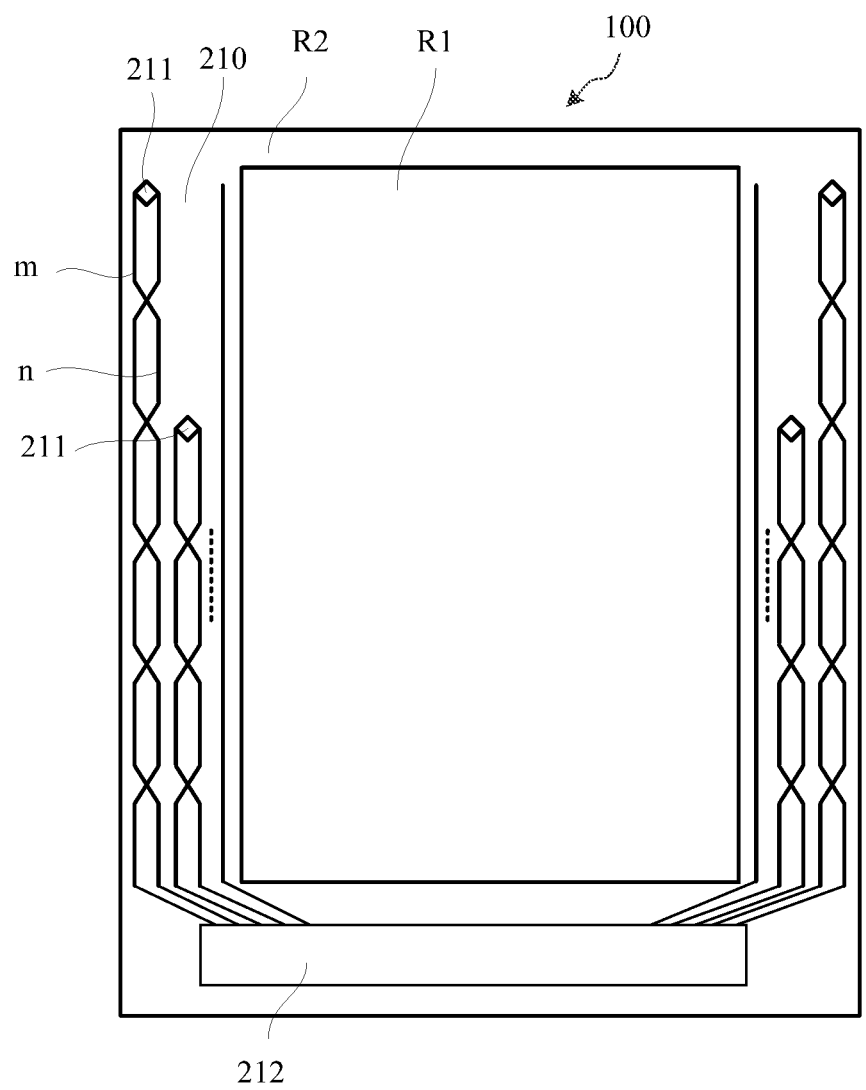
FIG. 6A illustrates a top-down view of another exemplary display substrate according to the disclosed embodiments.

FIG. 6A illustrates a top-down view of another exemplary display substrate according to the present disclosure. As shown in FIG. 6A, each pressure sensor 211 may be independently connected to a separate first pressure signal output line m and a separate second pressure signal output line n.

Figure 6B:
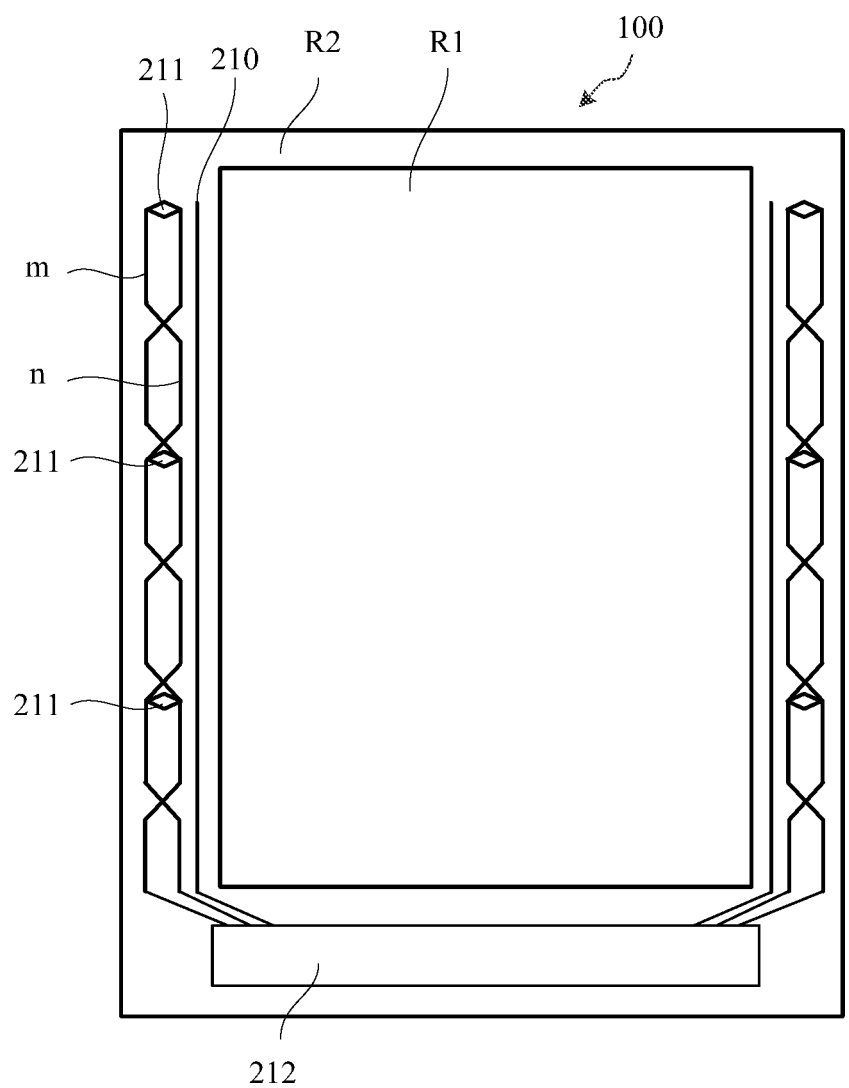
FIG. 6B illustrates a top-down view of another exemplary display substrate according to the disclosed embodiments.

FIG. 6B illustrates a top-down view of another exemplary display substrate according to the present disclosure. As shown in FIG. 6B, alternatively, the pressure sensor 211 that is far away from the driver chip 212 may share a portion of the first pressure signal output line m with the pressure sensor 211 that is close to the driver chip 212, and the pressure sensor 211 that is far away from the driver chip 212 may share a portion of the second pressure signal output line n with the pressure sensor 211 that is close to the driver chip 212.

Specifically, as shown in FIG. 6A, because the pressure sensors 211 located on s same side of the display region R1 are independently connected to separate first pressure signal output line m and separate second pressure signal output line n, each pressure sensor 211 may separately output the pressure sensing signals, which are carried to the driver chip 212 by the separate first pressure signal output line m and the separate second pressure signal output line n. Thus, the each pressure sensor 211 may operate independently or simultaneously.

Alternatively, the pressure sensors located on a side of the display region R1 may operate in a time-division mode. As shown in FIG. 6B, the pressure sensors 211 located on the same side of the display region may partially share one first pressure signal output line m and one second pressure signal output line n. In this case, the pressure sensor 211 that is far away from the driver chip 212 may share a portion of the first pressure signal output line m and a portion of the second pressure signal output line n with the pressure sensor 211 that is close to the driver chip 212. Thus, only two pressure signal output lines may be configured for a plurality of pressure sensors 211 located on a same side of the display region. To a large extent, the number of pressure signal output lines may be reduced, fabrication process complexity may be reduced, and bezels may be narrowed, making narrow bezel design achievable.

In certain embodiments, switches may be configured on the pressure signal output lines of each pressure sensor 211. By controlling the switches, pressure sensors 211 may operate in a time-division mode.

In one embodiment, the display signal 210 may include at least one of a clock signal line, an inverted clock signal line, and a trigger signal line. Thus, the display requirement for the pixels in the display region R1 of the display substrate 100 may be satisfied.

Figure 7:
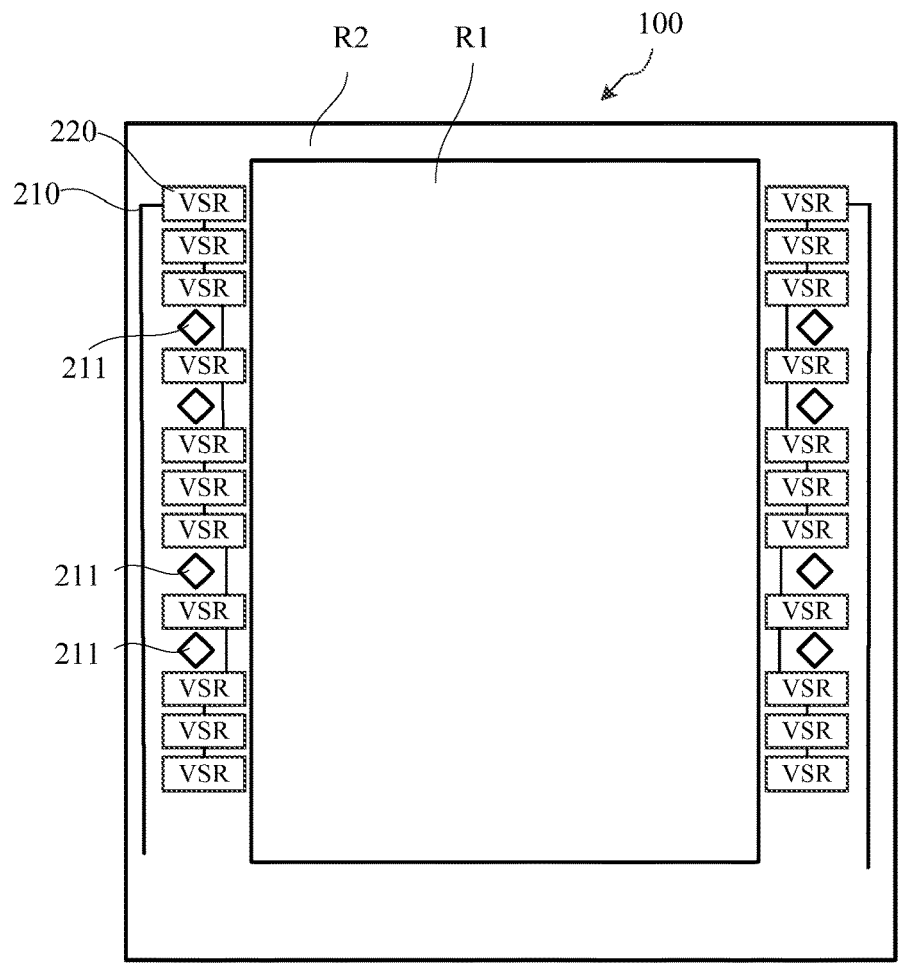
FIG. 7 illustrates a top-down view of another exemplary display substrate according to the disclosed embodiments.

FIG. 7 illustrates a top-down view of another exemplary display substrate according to the present disclosure. As shown in FIG. 7, cascaded shift registers 220 may be configured in the non-display region R2 of the display substrate 100. The display signal line 210 may be electrically connected to the cascaded shift registers 220. Each shift register 220 may be used to provide a scanning signal to a scanning line in the display region R1. Each pressure sensor 211 may be configured between two adjacent shift registers. Thus, the pressure sensors 211 may not occupy additional bezel area in the non-display region R2 of the display substrate 100, and may achieve the narrow bezel design of the display substrate 100.

Figure 8A:
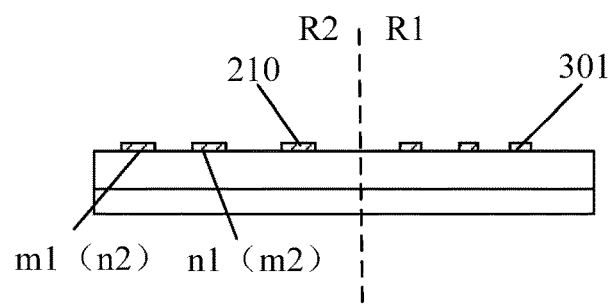
FIG. 8A illustrates a cross-sectional view of an exemplary display substrate according to the disclosed embodiments.

FIG. 8A illustrates a cross-sectional view of an exemplary display substrate according to the present disclosure. As shown in FIG. 8A, a first line section m1 and a second line section m2 of a first pressure signal output line m, a third line section n1 and a fourth line section n2 of a second pressure signal output line n, and the display signal line 210 may be disposed in a first metal layer. Because the four line sections and the display signal line 210 are located in the non-display region R2, and are paralleled with each other, configuring the four line sections and the display signal line 210 in a same metal layer may simplify the fabrication process.

In one embodiment, the display substrate 100 may also include data lines, scanning lines, and pixel capacitors located in the display region R1. First electrodes and second electrodes of the data lines, the scanning lines, and the pixel capacitors in the display region R1 may be made of metal or metal oxide. Thus, the first metal layer may also include the data lines. As shown in FIG. 8A, the first line section m1, the second line section m2, the third line section n1, the fourth line section n2, and a data line 301 are coplanar with each other.

Figure 8B:
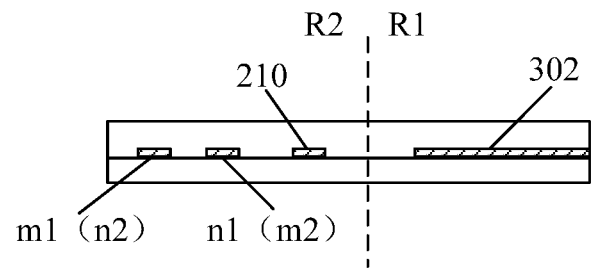
FIG. 8B illustrates a cross-sectional view of another exemplary display substrate according to the disclosed embodiments.

The first metal layer may also include scanning lines. FIG. 8B illustrates a cross-sectional view of another exemplary display substrate according to the present disclosure. As shown in FIG. 8B, the first line section m1, the second line section m2, the third line section n1, the fourth line section n2, and a scanning line 302 are coplanar with each other.

Figure 8C:
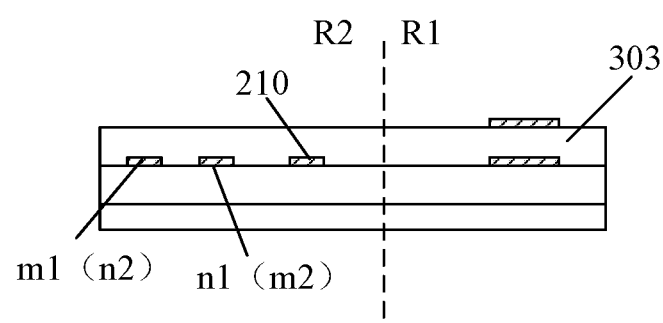
FIG. 8C illustrates a cross-sectional view of another exemplary display substrate according to the disclosed embodiments.

The first metal layer may also include first electrodes and second electrodes of pixel capacitors. FIG. 8C illustrates a cross-sectional view of another exemplary display substrate according to the present disclosure. As shown in FIG. 8C, the first line section m1, the second line section m2, the third line section n1, the fourth line section n2, and an electrode of a pixel capacitor 303 are coplanar with each other. The first electrode and the second electrode may be pixel electrode and common electrode.

In certain embodiments, the first line sections m1, the second line sections m2, the third line sections n1, the fourth line sections n2, and the existing structures in the display region R1 may be coplanar with each other, and may be formed in a same step of the fabrication process, thus effectively simplifying the fabrication process.

Figure 9A:
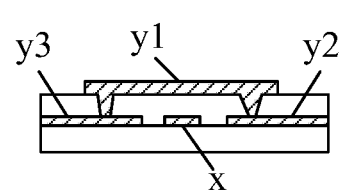
FIG. 9A illustrates a cross-sectional view of an exemplary crossing of first connecting section and second connecting section according to the disclosed embodiments.

FIG. 9A illustrates a cross-sectional view of an exemplary crossing of first connecting section and second connecting section according to the present disclosure. As shown in FIG. 9A, a first connecting section x of a first pressure signal output line m may be disposed in a first metal layer. A second connecting section y of a second pressure signal output line n may include at least a bridge portion y1 disposed in a second metal layer. Specifically, as shown in FIG. 9A, the second connecting section y of the second pressure signal output line n may also include a y2 portion and a y3 portion, which are disposed on both sides of the bridge portion y1 and are coplanar with the first connecting section x. The bridge portion y1 may be connected to the portion y2 and the portion y3 through the through-holes formed in an insulation layer.

Figure 9B:
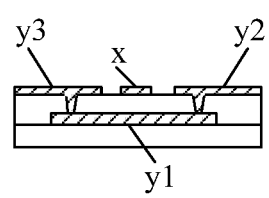
FIG. 9B illustrates a cross-sectional view of another exemplary crossing of first connecting section and second connecting section according to the disclosed embodiments.

FIG. 9A illustrates a cross-sectional view of another exemplary crossing of first connecting section and second connecting section according to the present disclosure. In one embodiment, as shown in FIG. 9A, the bridge portion y1 is disposed above the first connecting section x. In another embodiment, as shown in FIG. 9B, the first connecting section x may be disposed above the bridge portion y1.

In certain embodiments, the pressure sensor may be a bridge type pressure sensor or a semiconductor pressure sensor. For both types of pressure sensors, two bias voltage input terminals may be configured. Accordingly, a first bias voltage input line and a second bias voltage input line may be configured in the non-display region of the display substrate, and may be electrically connected to the two bias voltage input terminals of the corresponding pressure sensor.

Figure 10A:
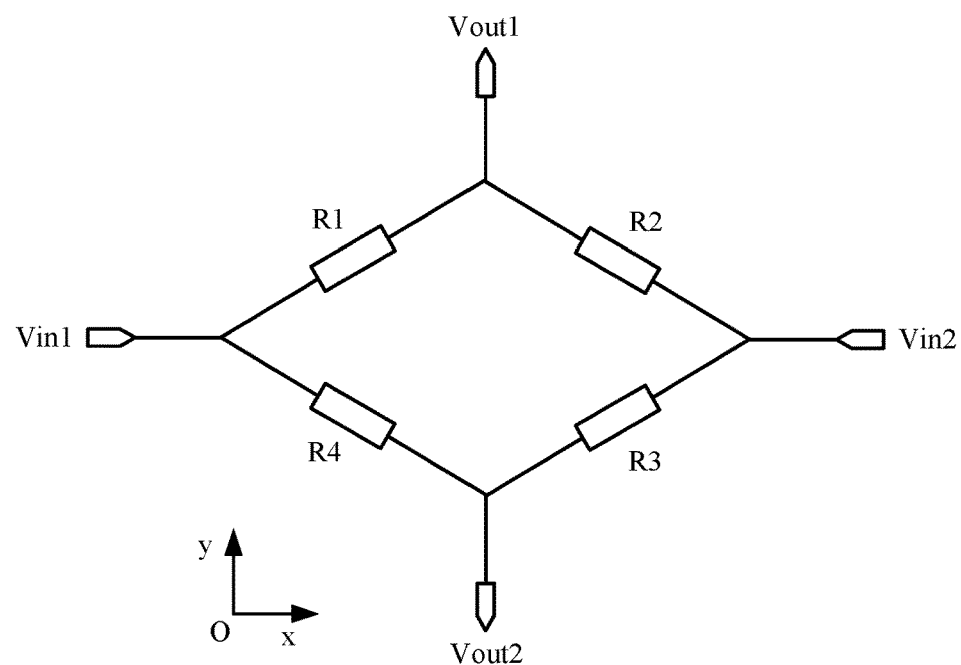
FIG. 10A illustrates an equivalent circuit diagram of an exemplary bridge type pressure sensor according to the disclosed embodiments.

FIG. 10A illustrates an equivalent circuit diagram of an exemplary bridge type pressure sensor according to the present disclosure. As shown in FIG. 10A, the pressure sensor may be a Wheatstone bridge type pressure sensor. Accordingly, the pressure sensor may include a first sensing resistor R1, a second sensing resistor R2, a third sensing resistor R3, and a fourth sensing resistor R4. A first end of the first sensing resistor R1 may be electrically connected to a first bias voltage input terminal Vin1, and a second end of the first sensing resistor R1 may be electrically connected to a first pressure signal output terminal Vout1. A first end of the second sensing resistor R2 may be electrically connected to a second bias voltage input terminal Vin2, and a second end of the second sensing resistor R2 may be electrically connected to a first pressure signal output terminal Vout1. A first end of the third sensing resistor R3 may be electrically connected to a second bias voltage input terminal Vin2, and a second end of the third sensing resistor R3 may be electrically connected to a second pressure signal output terminal Vout2. A first end of the fourth sensing resistor R4 may be electrically connected to a first bias voltage input terminal Vin1, and a second end of the fourth sensing resistor R4 may be electrically connected to a second pressure signal output terminal Vout2.

In the Wheatstone bridge type pressure sensor, the first sensing resistor R1, the second sensing resistor R2, the third sensing resistor R3, and the fourth sensing resistor R4 may be made of metallic material, or semiconductor material. The semiconductor material may be a polysilicon material film or an amorphous silicon material film.

In addition, the sensing resistors of the Wheatstone bridge type sensor may extend in different directions such that each sensing resistor may be subject to different resistance changes in different directions. Referring to FIG. 10A, two directions that are perpendicular to each other on the display substrate may be defined as a first extension direction x and a second extension direction y. Accordingly, the extension length from the first end to the second end of the first sensing resistor R1 may have a component on the first extension direction x greater than a component on the second extension direction y. The extension length from the first end to the second end of the second sensing resistor R2 may have a component on the second extension direction y greater than a component on the first extension direction x. The extension length from the first end to the second end of the third sensing resistor R3 may have a component on the first extension direction x greater than a component on the second extension direction y. The extension length from the first end to the second end of the fourth sensing resistor R4 may have a component on the second extension direction y greater than a component on the first extension direction x.

Thus, the first sensing resistor R1 and the third sensing resistor R3 on the display substrate may sense any deformation in the first extension direction x, and the second sensing resistor R2 and the fourth sensing resistor R4 on the display substrate may sense any deformation in the second extension direction y.

Generally, when the resistor bridge is balanced, a resistor relationship equation $$\frac{R1}{R4} = \frac{R2}{R3}$$

may be satisfied. According to the sensing resistor configuration, when a deformation occurs in the extension direction x, resistance of the first sensing resistor R1 and the third sensing resistor R3 may substantially change. According to the resistor relationship equation, when the resistance of one or both of the first sensing resistor R1 and the third sensing resistor R3 increases, the resistor relationship equation may no longer hold. Alternatively, when the resistance of one or both of the first sensing resistor R1 and the third sensing resistor R3 decreases, the resistor relationship equation may not hold either.

According to the sensing resistor configuration, when a deformation occurs in the extension direction y, resistance of the second sensing resistor R2 and the fourth sensing resistor R4 may substantially change. According to the resistor relationship equation, when the resistance of one or both of the second sensing resistor R2 and the fourth sensing resistor R4 increases, the resistor relationship equation may no longer hold. Alternatively, when the resistance of one or both of the second sensing resistor R2 and the fourth sensing resistor R4 decreases, the resistor relationship equation may not hold either. The above resistor configuration may improve the sensitivity of the pressure sensor.

Figure 10B:
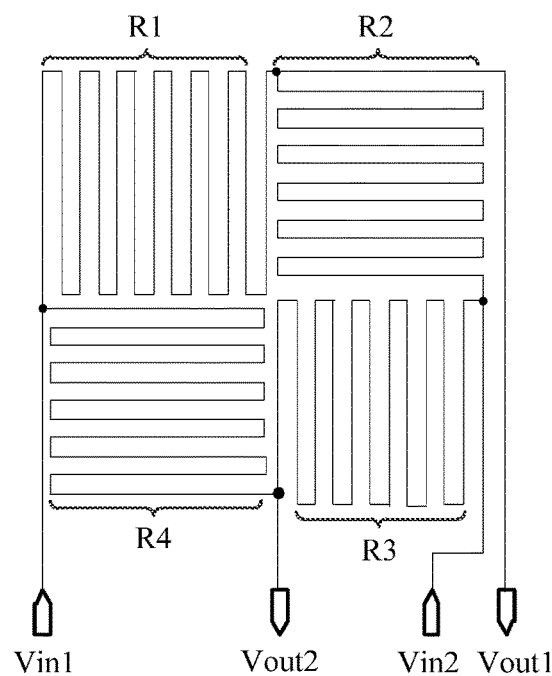
FIG. 10B illustrates a schematic diagram of an exemplary layout of pressure sensor according to the disclosed embodiments.

In one embodiment, the first sensing resistor R1, the second sensing resistor R2, the third sensing resistor R3, and the fourth sensing resistor R4 of the bridge type pressure sensor may be configured in a folded line shape. FIG. 10B illustrates a schematic diagram of an exemplary layout of pressure sensor according to the present disclosure. Referring to FIG. 10B, the first sensing resistor R1, the second sensing resistor R2, the third sensing resistor R3, and the fourth sensing resistor R4 in the folded line shape may be sequentially connected, and may be electrically connected to the first bias voltage input terminal Vin1, the first pressure signal output terminal Vout1, the second bias voltage input terminal Vin2, and the second pressure signal output terminal Vout2, respectively in the pressure sensor.

The sensing resistors in the folded line shape may be convenient for configuring different sensing resistors in different extension directions. In addition, the sensing resistors in the folded line shape may be electrically connected head to tail or vice versa such that the sensing resistors may be close to each other to eliminate the effect caused by the temperature differences of different sensing resistors.

Figure 10C:
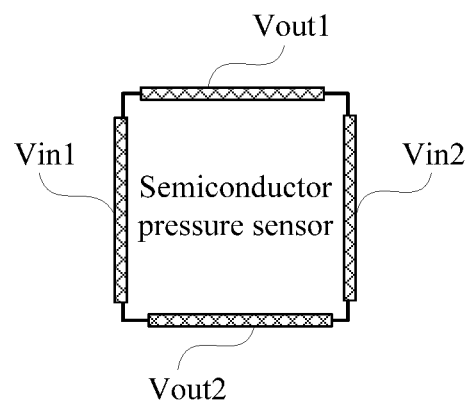
FIG. 10C illustrates a schematic view of an exemplary semiconductor pressure sensor according to the disclosed embodiments.

FIG. 10C illustrates a schematic view of an exemplary semiconductor pressure sensor according to the present disclosure. As shown in FIG. 10C, the semiconductor pressure sensor may be in a quadrilateral shape. The first bias voltage input terminal Vin1 and the second bias voltage input terminal Vin2 may be configured on two opposing sides of the quadrilateral, and the first pressure signal output terminal Vout1 and the second pressure signal output terminal Vout2 may be configured on the other two sides of the quadrilateral. The semiconductor pressure sensor may be made of a polysilicon material film or an amorphous silicon material film. The semiconductor pressure sensor may have advantages of small footprint and high pressure sensitivity.

Figure 11A:
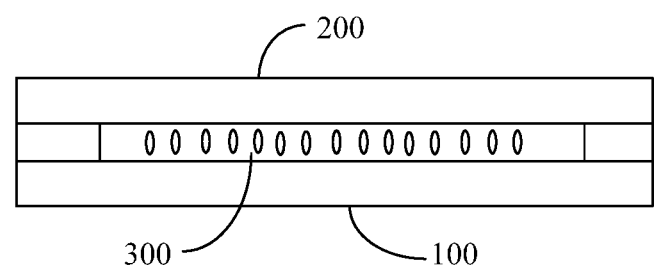
FIG. 11A illustrates a cross-sectional view of an exemplary display panel according to the disclosed embodiments.

FIG. 11A illustrates a cross-sectional view of an exemplary display panel according to the present disclosure. As shown in FIG. 11A, the display panel may include a display substrate 100 disclosed in the present disclosure. The display panel may be used in any display devices such as smart phone, computer, television set, smart watch, and information inquiry machine installed in the public area. As shown in FIG. 11A, the display panel may be a liquid crystal display panel. The display substrate 100 may be an array substrate of the liquid crystal display panel. In addition, the display panel may also include a color film substrate 200, and a liquid crystal layer 300 sandwiched between the arrays substrate 100 and the color film substrate 200.

Figure 11B:
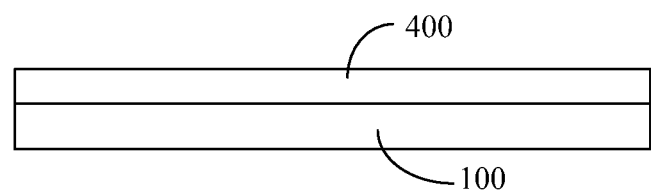
FIG. 11B illustrates a cross-sectional view of another exemplary display panel according to the disclosed embodiments.

FIG. 11B illustrates a cross-sectional view of another exemplary display panel according to the present disclosure. As shown in FIG. 11B, the display panel may be an organic light emitting display panel. The display substrate 100 may be an array substrate. In addition, the display panel may also include a cover 400 disposed above the array substrate.

The display panel according to the present disclosure divides the first pressure signal output line and the second pressure signal output line into a plurality of line sections, which have different distances to the display signal line. Each pressure signal output line includes a plurality of line sections. The coupling noises appearing on different pressure signal output lines are equalized to improve the precision of the pressure measurement.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display substrate, comprising a display region and a non-display region surrounding the display region, wherein the non-display region includes:
   at least one display signal line;
   at least one pressure sensor configured with two pressure signal output terminals; and
   a first pressure signal output line and a second pressure signal output line that correspond to the at least one pressure sensor, and are electrically connected to the two pressure signal output terminals of the corresponding pressure sensor, respectively, wherein:
     the first pressure signal output line includes at least one first line section and at least one second line section;
     the at least one first line section and the at least one second line section are electrically connected by a first connecting section;
     the second pressure signal output line includes at least one third line section and at least one fourth line section;
     the at least one third line section and the at least one fourth line section are electrically connected by a second connecting section;
     the at least one first line section, the at least one second line section, the at least one third line section, and the at least one fourth line section are configured in parallel to the at least one display signal line;
     the at least one first line section and the at least one third line section have a first distance to the at least one display signal line;
     the at least one second line section and the at least one fourth line section have a second distance to the at least one display signal line; and
     the first distance is greater than the second distance.

2. The display substrate according to claim 1, wherein:
   a total length of all first line sections of the first pressure signal output line is equal to a total length of all third line sections of the second pressure signal output line; and
   a total length of all second line sections of the first pressure signal output line is equal to a total length of all fourth line sections of the second pressure signal output line.

3. The display substrate according to claim 2, wherein:
   the first pressure signal output line includes a first number of the at least one first line sections and a first number of the at least one second line section;
   the second pressure signal output line includes a second number of the at least one third line sections and a second number of the at least one fourth line sections; and
   the first number is equal to the second number.

4. The display substrate according to claim 3, wherein:
   the at least one first line sections, the at least one second line sections, the at least one third line sections, and the at least one fourth line section have an equal length.

5. The display substrate according to claim 2, wherein:
   the first connecting section and the second connecting sections are paired and crossed with each other, and arranged alternately.

6. The display substrate according to claim 5, wherein:
   the non-display region further includes one or more of the first connecting section, and one or more of the second connecting section,
   a ratio of a total length of the one or more of the first connecting sections over a length of the first pressure signal output line is less than 1:10; and
   a ratio of a total length of the one or more of the second connecting section over a length of the second pressure signal output line is less than 1:10.

7. The display substrate according to claim 5, wherein:
   a section length of an orthogonal projection of the first connecting section on an extension direction of the at least one display signal line is equal to a section length of an orthogonal projection of the paired second connecting section on the extension direction of the at least one display signal line.

8. The display substrate according to claim 1, wherein:
   the at least one first line section and the at least one second line section of the first pressure signal output line includes a plurality of first line sections and a plurality of second line sections, respectively; and the at least one third line section and the at least one fourth line section of the second pressure signal output line includes a plurality of third line sections and a plurality of fourth line sections, respectively.

9. The display substrate according to claim 1, wherein:
a driver chip is configured in the non-display region; and
the first pressure signal output line and the second pressure signal output line are electrically connected to the driver chip.

10. The display substrate according to claim 9, wherein:
the at least one pressure sensor is independently connected to a separate first pressure signal output line and a separate second pressure signal output line; or
a pressure sensor of the at least one pressor sensor that is far away from the driver chip shares a portion of the first pressure signal output line with a pressure sensor of the at least one pressor sensor that is close to the driver chip, and the pressure sensor that is far away from the driver chip shares a portion of the second pressure signal output line with the pressure sensor that is close to the driver chip.

11. The display substrate according to claim 1, wherein:
the at least one display signal line includes at least one of a clock signal line, an inverted clock signal line, and a trigger signal line.

12. The display substrate according to claim 11, wherein:
cascaded shift registers are configured in the non-display region;
the at least one display signal line is electrically connected to the cascaded shift registers; and
the at least one pressure sensor is configured between two adjacent shift registers.

13. The display substrate according to claim 1, wherein:
the at least one first line sections and the at least one second line sections of the first pressure signal output line, the at least one third line sections and the at least one fourth line sections of the second pressure signal output line, and the at least one display signal line are disposed in a first metal layer.

14. The display substrate according to claim 13, wherein:
the first connecting sections is disposed in the first metal layer; and
the second connecting sections includes at least a bridge portion in a second metal layer.

15. The display substrate according to claim 13, further including data lines, scanning lines, and pixel capacitors disposed in the display region, wherein:
the first metal layer includes the data lines; or
the first metal layer includes the scanning lines; or
the first metal layer includes first electrodes or second electrodes of the pixel capacitors.

16. The display substrate according to claim 1, wherein:
the at least one pressure sensor is a bridge type pressure sensor or a semiconductor pressure sensor.

17. The display substrate according to claim 16, wherein:
the at least one pressure sensor includes two bias voltage input terminals; and
a first bias voltage input line and a second bias voltage input line corresponding to the at least one pressure sensor are configured in the non-display region, and are electrically connected to the two bias voltage input terminals of the at least one pressure sensor.

18. A display panel, comprising a display substrate, wherein the display substrate includes a display region and a non-display region surrounding the display region, wherein the non-display region includes:
at least one display signal line;
at least one pressure sensor configured with two pressure signal output terminals; and
a first pressure signal output line and a second pressure signal output line that correspond to the at least one pressure sensor, and are electrically connected to the two pressure signal output terminals of the corresponding pressure sensor, respectively, wherein:
the first pressure signal output line includes at least one first line section and at least one second line section;
the at least one first line section and the at least one second line section are electrically connected by a first connecting section;
the second pressure signal output line includes at least one third line section and at least one fourth line section;
the at least one third line section and the at least one fourth line section are electrically connected by a second connecting section;
the at least one first line section, the at least one second line section, the at least one third line section, and the at least one fourth line section are configured in parallel to the at least one display signal line;
the at least one first line section and the at least one third line section have a first distance to the at least one display signal line;
the at least one second line section and the at least one fourth line section have a second distance to the at least one display signal line; and
the first distance is greater than the second distance.

19. The display panel according to claim 18, wherein the display substrate is an array substrate.

20. The display panel according to claim 18, wherein the display panel is a liquid crystal display panel or an organic light emitting display panel.

* * * * *